(12) United States Patent
Shin et al.

(10) Patent No.: US 11,688,795 B2
(45) Date of Patent: Jun. 27, 2023

(54) SEMICONDUCTOR DEVICE WITH CONTROLLABLE CHANNEL LENGTH AND MANUFACTURING METHOD OF SEMICONDUCTOR DEVICE WITH CONTROLLABLE CHANNEL LENGTH

(71) Applicant: KEY FOUNDRY CO., LTD., Cheongju-si (KR)

(72) Inventors: Hyun Kwang Shin, Cheongju-si (KR); Jung Hwan Lee, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 17/735,500

(22) Filed: May 3, 2022

(65) Prior Publication Data

US 2022/0262927 A1 Aug. 18, 2022

Related U.S. Application Data

(63) Continuation of application No. 16/747,617, filed on Jan. 21, 2020, now Pat. No. 11,362,197.

(30) Foreign Application Priority Data

Jul. 25, 2019 (KR) .......................... 10-2019-0090532

(51) Int. Cl.
*H01L 29/66* (2006.01)
*H01L 29/06* (2006.01)
*H01L 29/86* (2006.01)

(52) U.S. Cl.
CPC .... *H01L 29/66674* (2013.01); *H01L 29/0646* (2013.01); *H01L 29/86* (2013.01)

(58) Field of Classification Search
CPC ........... H01L 29/66674; H01L 29/0646; H01L 29/0642; H01L 29/86; H01L 29/0692;
(Continued)

(56) References Cited

U.S. PATENT DOCUMENTS 6,677,210 B1 * 1/2004 Hebert ................ H01L 29/7816
257/E29.136
9,236,470 B2 1/2016 Hebert et al.
(Continued)

FOREIGN PATENT DOCUMENTS

JP 11-243205 A 9/1999
JP 2014-175640 A 9/2014
(Continued)

OTHER PUBLICATIONS

Korean Office Action dated Aug. 23, 2020 in counterpart Korean Patent Application No. 10-2019-0090532 (8 pages in Korean).
(Continued)

*Primary Examiner* — Natalia A Gondarenko
(74) *Attorney, Agent, or Firm* — NSIP Law

(57) ABSTRACT

A semiconductor device is disclosed. A semiconductor device according to an example of the present disclosure includes a gate electrode of a ring shape having an opening area on a substrate; a P-type deep well region formed in the opening area; a drain region formed on the P-type deep well region; an N-type well region overlapping with the gate electrode; a source region formed in the N-type well region; a bulk tab region formed by being isolated from the source region by a first isolation region; a P-type drift region formed in contact with the N-type well region; and a second isolation region formed near the bulk tab region.

19 Claims, 15 Drawing Sheets

(58) Field of Classification Search
CPC ............. H01L 29/7835; H01L 29/0653; H01L 29/7801; H01L 27/088–0928; H01L 29/0843; H01L 29/0852; H01L 29/0882; H01L 29/0865; H01L 29/0696; H01L 21/823493; H01L 21/762; H01L 21/823412; H01L 21/823481; H01L 21/823892; H01L 2924/1306; H01L 2924/13063; H01L 29/1029; H01L 29/1095; H01L 29/42312; H01L 29/42316; H01L 29/4232; H01L 29/768; H01L 29/7816–7826; H01L 29/7836; H01L 29/66681–66704; H01L 29/66659
USPC .......... 257/25, 335, 337, 324, 343, E29.256, 257/29.261, 29.268
See application file for complete search history.

(56) References Cited

U.S. PATENT DOCUMENTS

| | | | |
|---|---|---|---|
| 9,590,097 B2 * | 3/2017 | Yang | ................ H01L 29/0634 |
| 9,698,258 B2 | 7/2017 | Ryu et al. | |
| 9,941,350 B1 | 4/2018 | Lin et al. | |
| 10,217,862 B2 | 2/2019 | Mori et al. | |
| 10,461,182 B1 | 10/2019 | Edwards et al. | |
| 2003/0038316 A1 | 2/2003 | Tsuchiko et al. | |
| 2008/0061368 A1 | 3/2008 | Williams et al. | |
| 2011/0089492 A1 | 4/2011 | Yilmaz | |
| 2013/0344671 A1 * | 12/2013 | Kim | ................ H01L 29/0696 438/286 |
| 2014/0001548 A1 | 1/2014 | Chen et al. | |
| 2014/0027846 A1 * | 1/2014 | Cha | ................ H01L 29/0878 257/337 |
| 2014/0151793 A1 | 6/2014 | Cha et al. | |
| 2015/0069509 A1 | 3/2015 | Lee et al. | |
| 2015/0325651 A1 * | 11/2015 | Yao | ................ H01L 29/0847 438/286 |
| 2018/0151725 A1 | 5/2018 | Lee | |
| 2019/0288063 A1 | 9/2019 | Komatsu et al. | |

FOREIGN PATENT DOCUMENTS

| | | |
|---|---|---|
| KR | 10-0462365 B1 | 12/2004 |
| KR | 10-2011-0059345 A | 6/2011 |
| KR | 10-2015-0028602 A | 3/2015 |
| KR | 10-2016-0077541 A | 7/2016 |

OTHER PUBLICATIONS

Korean Office Action dated Feb. 2, 2021 in corresponding Korean Patent Application No. 10-2019-0090532 (7 pages in Korean).

* cited by examiner

SEMICONDUCTOR DEVICE WITH CONTROLLABLE CHANNEL LENGTH AND MANUFACTURING METHOD OF SEMICONDUCTOR DEVICE WITH CONTROLLABLE CHANNEL LENGTH

CROSS-REFERENCE TO RELATED APPLICATIONS

This application is a continuation of U.S. application Ser. No. 16/747,617 filed on Jan. 21, 2020, which claims the benefit under 35 USC 119(a) of Korean Patent Application No. 10-2019-0090532 filed on Jul. 25, 2019 in the Korean Intellectual Property Office, the entire disclosure of which is incorporated herein by reference for all purposes.

BACKGROUND

1. Field

The following description relates to a semiconductor device. The following description also relates to a high voltage semiconductor device with a controllable channel length and a manufacturing method of a high voltage semiconductor device with a controllable channel length.

2. Description of Related Art

In general, integrated circuits (ICs) in which one or more high voltage transistors are situated on the same chip along with low voltage circuits may be widely used in many electrical applications. Among such integrated circuits, Extended Drain Metal-Oxide-Semiconductor (EDMOS) transistors, Laterally Double Diffused Metal-Oxide-Semiconductor (LDMOS) transistors, and similar transistors are valuable high voltage semiconductor devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a P-type well region disposed in a substrate, an N-type well region spaced apart from the P-type well region, a P-type drift region disposed between the N-type well region and the P-type well region, a gate electrode having a ring shape, including an opening area, formed on the P-type well region, the N-type well region and the P-type drift region, a P-type source region disposed in the N-type well region, configured to form a channel region between the P-type source region and the P-type drift region, a P-type drain region disposed in the P-type well region, a first isolation region that overlaps with the gate electrode and disposed adjacent of the P-type drain region, and a second isolation region disposed to be spaced apart from the first isolation region, wherein the second isolation region has a depth greater than a depth of the first isolation region.

The semiconductor device may further include a P-type deep well region disposed below the P-type well region.

The semiconductor device may further include an N-type deep well region disposed below the N-type well region and spaced apart from the P-type deep well region, wherein the second isolation region may have a depth greater than a depth of the N-type deep well region.

The semiconductor device may further include an N-type bulk tab region disposed in the N-type well region and spaced apart from the P-type source region, and an N-type buried impurity layer disposed in the substrate and directly contacting the second isolation region.

A channel length of the channel region may be controlled by extending or shrinking an overlap region at which the N-type well region and the gate electrode overlap with each other.

One or more of outer edge corners of the P-type deep well region may have a first radius of curvature, one or more of inner edge corners of the gate electrode may have a second radius of curvature, and one or more of inner edge corners of the N-type well region may have a third radius of curvature.

The radiuses of curvature may increase in an order of the first radius of curvature, second radius of curvature, and third radius of curvature.

The semiconductor device may further include a P-type epitaxial layer disposed between the N-type deep well region and the P-type deep well region.

The P-type deep well region and the P-type well region may be disposed in the opening area.

In another general aspect, a semiconductor device may include a first N-type well region disposed in a substrate, a first P-type drift region disposed to be in contact with the first N-type well region, a first gate electrode that overlaps with the first N-type well region and the first P-type drift region, a second N-type well region disposed to be spaced apart from the first N-type well region, a second P-type drift region disposed to be in contact with the second N-type well region, a second gate electrode that overlaps with the second N-type well region and the second P-type drift region, a P-type well region disposed to be in contact with the first P-type drift region and the second P-type drift region, a drain region disposed in the P-type well region, a first source region disposed in the first N-type well region, and a second source region disposed in the second N-type well region, wherein a ring-shaped gate electrode comprising an opening area is formed by forming a connection between the first gate electrode and the second gate electrode.

The drain region may be disposed inside the opening area, and the first and second source regions may be disposed outside the opening area.

The semiconductor device may further include a first isolation region that overlaps with the first gate electrode and disposed adjacent to the drain region, a second isolation region disposed spaced apart from the first isolation region and enclosing the first gate electrode and the second gate electrode, wherein the second isolation region may have a depth greater than a depth of the first isolation region, and a buried oxide film disposed in the substrate, wherein the buried oxide film may be disposed to be in contact with the second isolation region.

The ring-shaped gate electrode may have at least one of its inner corners as having a round shape.

A channel length of a channel region may be controlled by extending or shrinking an overlapping region at which the first N-type well region and the ring-shaped gate electrode overlap with each other.

The semiconductor device may further include a first N-type deep well region disposed to be in contact with the first N-type well region, a P-type deep well region disposed to be in contact with the P-type well region, a P-type epitaxial layer disposed between the first N-type deep well region and the P-type deep well region, and an N-type buried impurity layer disposed below the first N-type deep well region and the P-type deep well region.

In another general aspect, a semiconductor device includes a P-type drift region disposed between a P-type well region disposed in a substrate and an N-type well region, the P-type well region being spaced apart from the N-type well region, a gate electrode having a ring shape surrounding an opening area, formed on the P-type well region, the N-type well region and the P-type drift region, a P-type source region disposed in the N-type well region, configured to form a channel region between the P-type source region and the P-type drift region, a first isolation region that overlaps with the gate electrode, and a second isolation region disposed to be spaced apart from the first isolation region.

The second isolation region may have a depth greater than a depth of the first isolation region.

The semiconductor device may further include a P-type drain region disposed in the P-type well region.

The semiconductor device may further include a P-type deep well region disposed below the P-type well region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
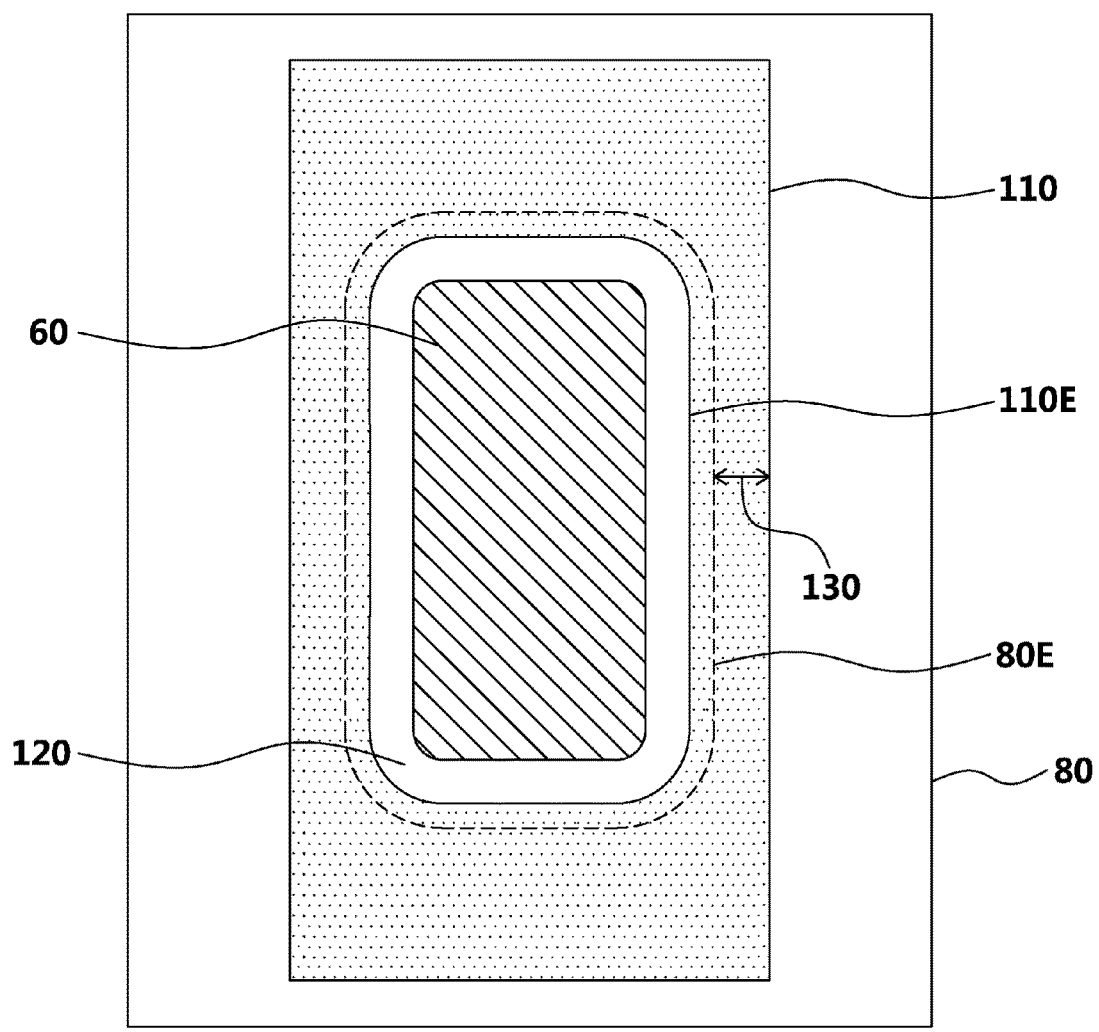
FIG. 1 is a top view according to an example of a semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening there between. In contrast, when an element is described as being "directly on," "directly connected to," or "directly coupled to" another element, there can be no other elements intervening there between.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In designing a high voltage semiconductor device, a continuous scale down may be helpful and sufficient operating characteristics are to be secured, as the degree of integration of semiconductor devices increases.

Alternatives may have a limitation in implementing high voltage with a rectangular type of pEDMOS. In addition, when junction isolation is used in a bulk wafer, the chip size may increase due to the area occupied by the junction isolation region. Further, junction isolation techniques may have a limitation with respect to implementing a high breakdown voltage (BVDSS). In addition, a rectangular type of pEDMOS may have a limitation in that a high breakdown voltage may not be able to be obtained because electric fields may be concentrated at each corner of the rectangular pEDMOS.

The semiconductor device according to the examples is described in further detail by discussing an example case where it is applied to an EDMOS transistor having a P channel. In the following description, N-type is referred to as a first conductivity type and P-type is referred to as a second conductivity type. Of course, the technical gist of the present disclosure may be equally applied to an EDMOS transistor having a N channel, and in the case of nEDMOS, the first conductivity type is P-type and the second conductivity type is N-type.

In addition, in the following description, when the substrate of the semiconductor device is P-type, the well region is N-type, and according to another example, when the substrate is N-type, the well region is P-type.

The present disclosure provides a semiconductor device that may be capable of securing a sufficient operating voltage and increasing the integration degree, and of ensuring a breakdown voltage greater than the operating voltage in a high voltage semiconductor device with a controllable channel length.

FIG. 1 is a top view according to an example of a semiconductor device.

Referring to the example of FIG. 1, the plan view of the semiconductor device 300 shows a P-type deep well region 60, an N-type well region 80, 80E and a gate electrode 110, 110E formed on the P-type deep well region 60 and the N-type well region 80, 80E. In such an example, the number 80E denotes an inner periphery of the N-type well region 80. The number 110E also denotes an inner periphery of the gate electrode 110. The P-type deep well region 60 may have a round shape at each corner. The N-type well region 80 may also have a round shape at each inside corner, as shown with respect to well region 80E. However, the outer periphery of well region 80 has a rectangular shape. The gate electrode 110 may also have a similar shape as the N-type well region 80. The gate electrode 110 may also have a round shape at each inside corner, as shown with respect to gate electrode 110E, and may have an opening area 120 inside the gate electrode 110. However, the outer periphery of the gate electrode 110 may have a rectangular shape. Also, there may be an overlapping region 130 between the gate electrode 110 and the N-type well region 80. The overlapping region 130 may be used for extending or shrinking the channel length of the channel region.

Figure 2:
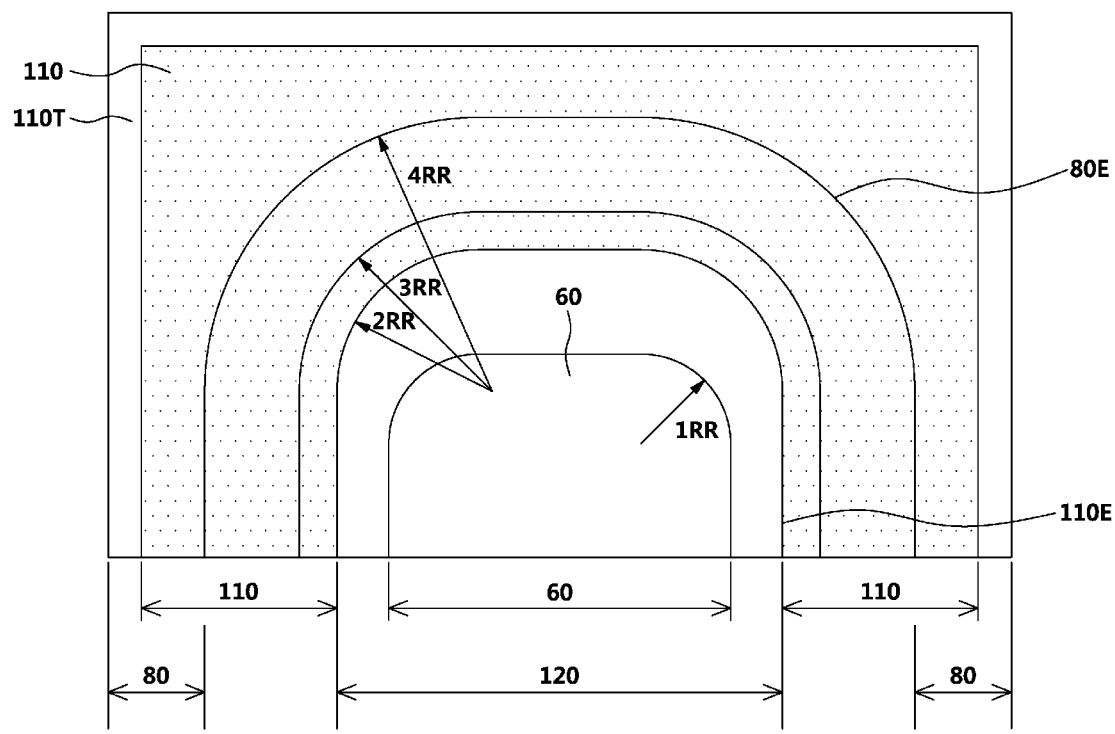
FIG. 2 is a half top view illustrating a curvature of corners in the semiconductor device shown in the example of FIG. 1.

FIG. 2 is a half top view illustrating a curvature of the corners in the semiconductor device shown in the example of FIG. 1.

Referring to the example of FIG. 2, the semiconductor device 300 may include the P-type deep well region 60 formed to be round with a constant curvature K, so that each corner is not angular. For example, the P-type deep well region 60 may be formed in the shape of a rounded rectangle. Therefore, the P-type deep well region 60 may be formed to have a constant radius of curvature 1RR in each corner region.

Referring to the example of FIG. 2, the inner edge 110E of the gate electrode 110 may be formed to be round with a constant curvature K, so that the corner is not angular. Thus, the inner edge 110E of the gate electrode 110 is formed to have a constant radius of curvature 2RR in each corner region. In such an example, the radius of curvature 2RR of the corner of the inner edge 110E of the gate electrode 110 may be greater than the radius of curvature 1RR of the corner of the P-type deep well region 60. Thus, 3RR in the example of FIG. 2 denotes a radius of curvature at corner of a highly doped P-type region that overlaps with the gate electrode 110.

Referring to the example of FIG. 2, the N-type well region 80 may be formed as a closed loop, of which the center is open. The edge 80E of the N-type well region 80 may also be formed to be round with a constant curvature K, so that each corner is not angular. Thus, the N-type well region 80 may be formed to have a constant radius of curvature 4RR in each corner region. In such an example, the radius of curvature 4RR of the corner of the inner edge 80E of the N-type well region 80 may be greater than the radius of curvature 2RR of the edge corner of the gate electrode 110.

Therefore, at least one of the outer edge corners of the P-type deep well region 60 may haves a first radius of curvature 1RR, at least one of the inner edge corners of the gate electrode 110 may have a second radius of curvature 2RR, and at least one of the corners of an inner edge of the N-type well region 80 may have a third radius of curvature 4RR, and these elements may be arranged in a semiconductor device having a radius of curvature of which an order of radii of curvature is the first, second, and third radii of curvature 1RR, 2RR and 4RR.

Figure 3:
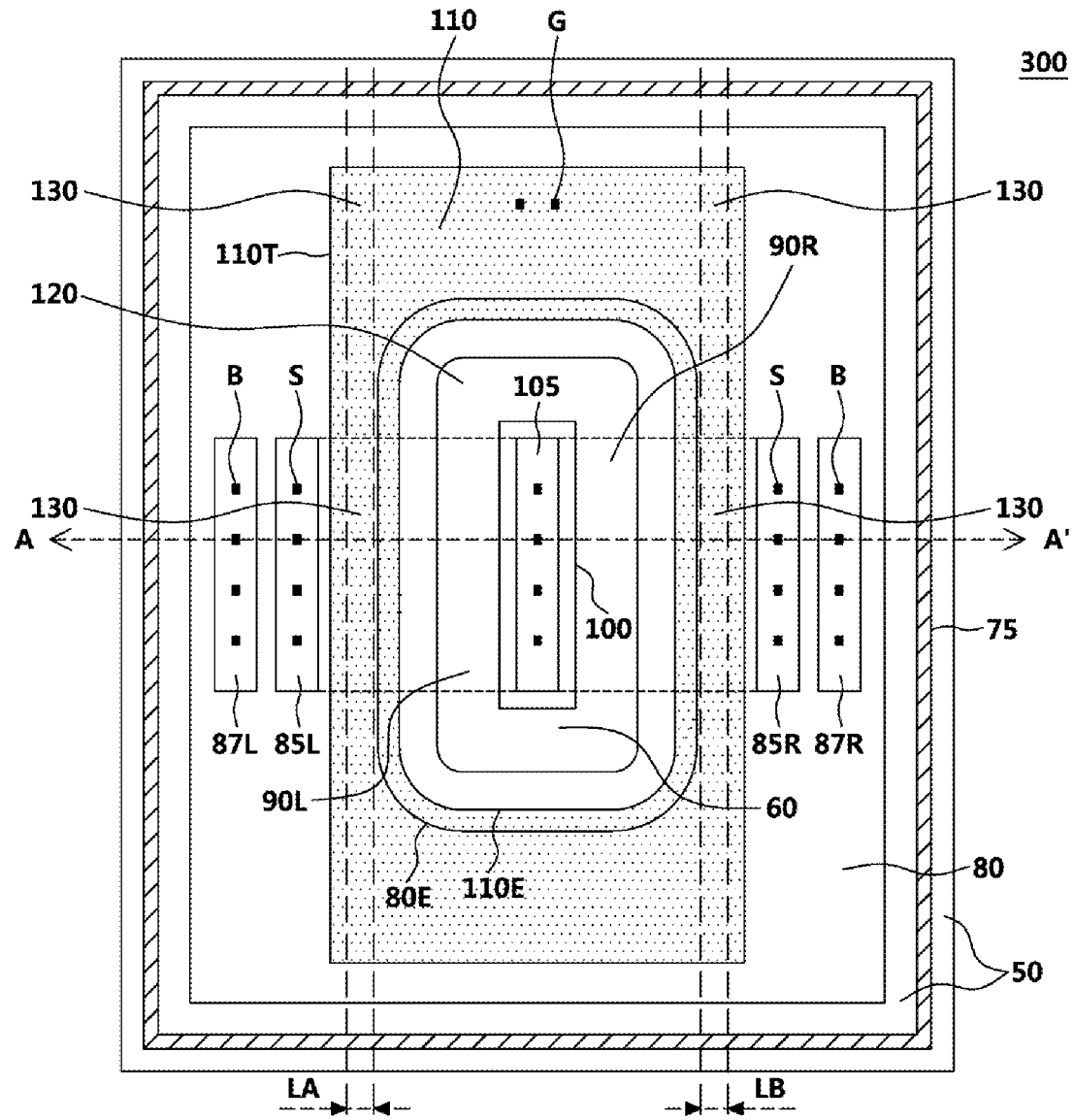
FIG. 3 is a top view according to an example of a semiconductor device.

FIG. 3 is a top view, according to an example, of a semiconductor device.

Referring to the example of FIG. 3, a semiconductor device 300 may include a P-type deep well (DPW) 60, a P-type well (PW) 100, a gate electrode 110, an N-type well (NW) 80, and an N-type deep well (DNW) 50. Each corner of the P-type deep well region 60 may be designed to be a round type corner having a constant curvature so as to have the P-type deep well region 60 has a rounded rectangular shape. Accordingly, a high electric field at the corners may be reduced. Such a reduction in electric field may enable the breakdown voltages to implement greater than 280 V or even as great a voltage as 400 V. However, an outer periphery of the P-type well region 100 inside the P-type deep well region 60 may have a rectangular shape.

Referring to the example of FIG. 3, each corner of the inner edge 110E of the gate electrode 110 may be designed to be of a round type of corner having a constant curvature, so as to have a rounded rectangular shape, and accordingly, a high electric field at the corners may be reduced. By contrast, the outer edge 110T of the gate electrode 110 may have a rectangular shape. In addition, the gate electrode 110 may have a ring shape and may have an opening area 120 inside the gate electrode 110.

Each corner of the inner edge 80E of the N-type well region 80 may be designed to have a round type having a constant curvature, so as to have a rounded rectangular shape. Accordingly, a high electric field may be reduced. Additionally, an isolation region 75 may formed in the shape of a closed loop surrounding the semiconductor device 300, as shown in the top view in the example of FIG. 3.

Referring to the example of FIG. 3, a channel length in the semiconductor device 300 may be controlled by extending or shrinking an overlapping region 130 in which the N-type well region 80 and the ring shape gate electrode 110 overlap with each other. During the extension or shrinkage of the overlapping region 130, each curvature of the P-type deep well region 60, the inner edge 110E of the gate electrode 110, and the inner edge 80E of the N-type region 80 may keep a constant curvature. In such an example, the overlapping region 130 may have a lateral length LA or LB, as shown in the example of FIG. 3.

When each curvature changes as the channel length varies, the drain current may gradually increase along with the drain voltage so that the semiconductor device 300 cannot be used as an analog device. However, when the curvature is kept constant even if the channel length varies, the drain current may be constant so that the semiconductor device 300 is suitable for use as an analog device.

An alternative CMOS device may also be able to easily control the channel. However, CMOS devices with an easily controllable channel do not have corner rounding, as with the structure of the present examples. Therefore, it may not be efficient and/or effective when such a CMOS device is applied to use as a high voltage device. In addition, the alternative high voltage devices (HV device) may use a rounded shape, and has the channel length which is not easily controllable. The structure of the present examples may be designed to have an easily controllable channel length as well as the corner rounding to satisfy both features.

Figure 4:
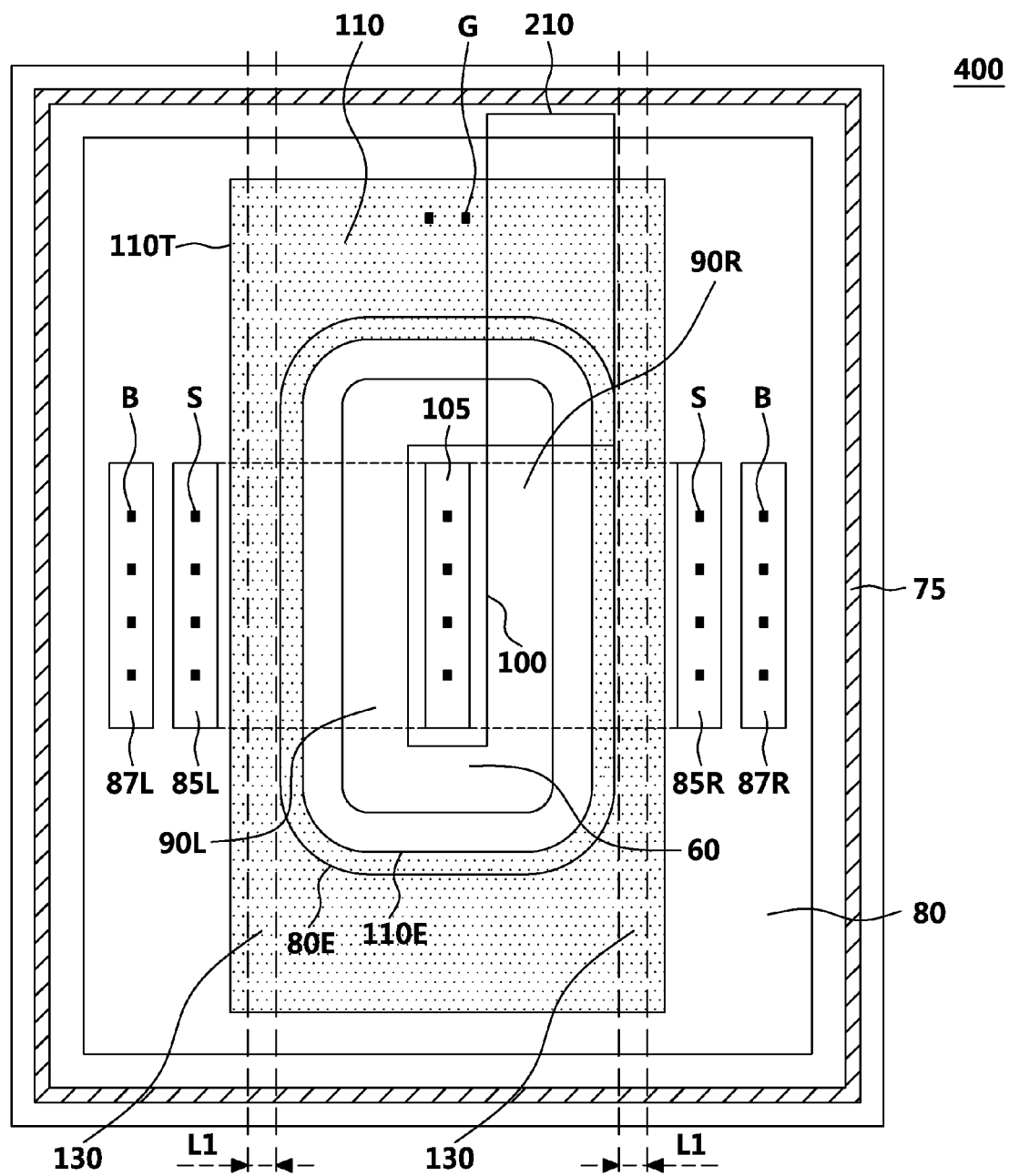
FIG. 4 is a top view according to an example of a semiconductor device with a controllable channel length.
Figure 5:
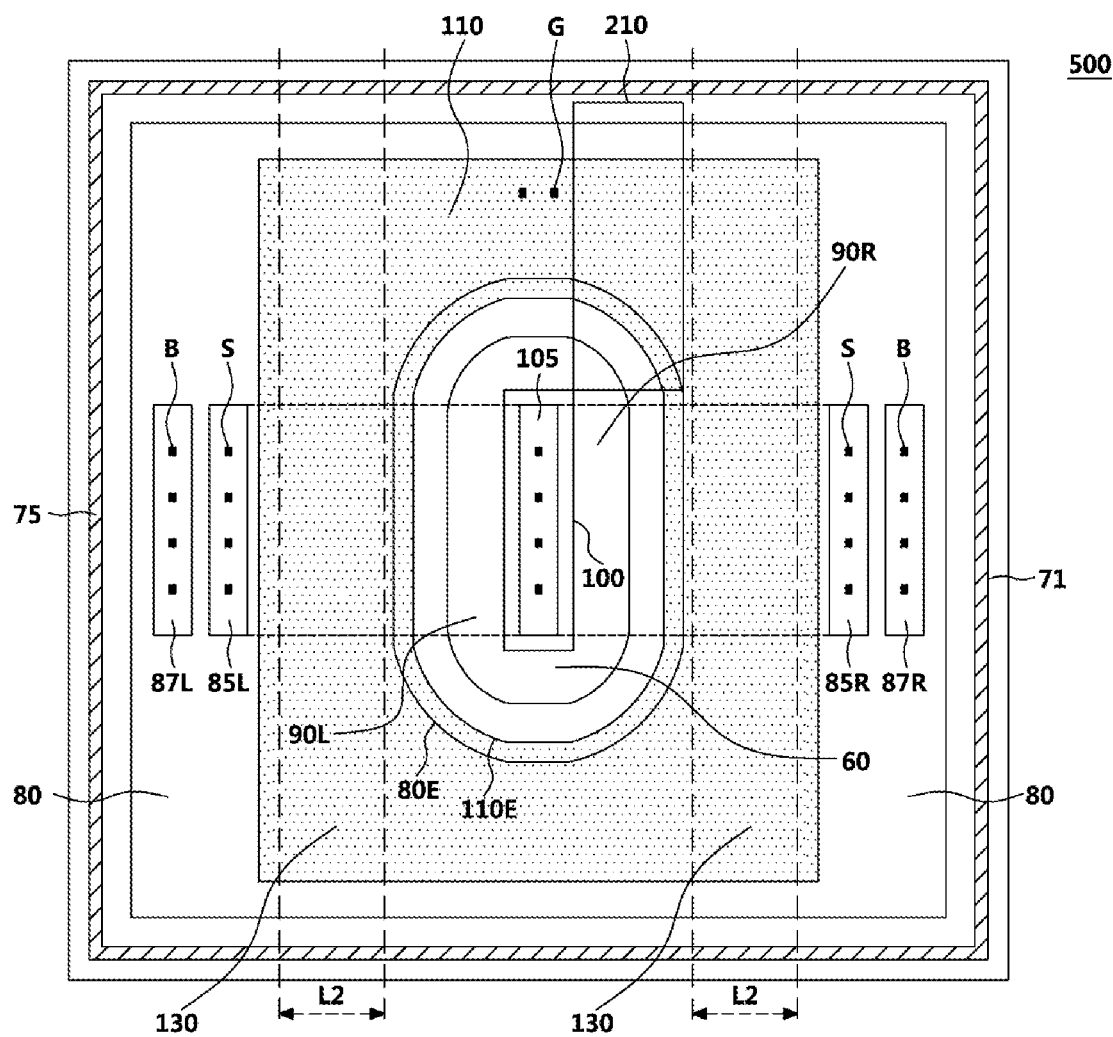
FIG. 5 is a top view according to an example of a semiconductor device with a controllable channel length.

FIG. 4 and FIG. 5 are each a top view of the semiconductor device with a controllable channel length of the examples.

As shown in the examples of FIG. 4 and FIG. 5, each of the first and second semiconductor devices 400 and 500 according to the examples may have the inner edge 110E of the gate electrode 110, the outer edge of the P-type deep well region 60, and the inner edge 80E of the N-type well region 80, with each edge having a shape of a rounded rectangle. By designing the corners of each square-shaped or rectangular element to have a rounded edge type with a constant curvature, an electric field may be prevented from being concentrated. The first and second semiconductor devices 400 and 500 of the examples may vary the width of the X-axis on the horizontal plane of the N-type well region 80 according to various non-limiting examples.

As shown in the examples of FIG. 4 and FIG. 5, the first and second semiconductor devices 400 and 500 may have a first channel length L1 and a second channel length L2, respectively. The first channel length L1 in the first semiconductor device 400 may be changed to the second channel L2 in the second semiconductor device 500. In such examples, the size of the rectangular box 210 is not changed. For example, the curvature of each area in rectangular box 210 may be fixed. Even if the width of the X-axis varies, the curvature of the corner edges of the rectangle may remain uniform. Thus, the inner edge 110E of the gate electrode 110, the outer edge of the P-type deep well region 60, and the inner edge 80E of the N-type well region 80 may each have a shape of a rounded rectangle.

Figure 6:
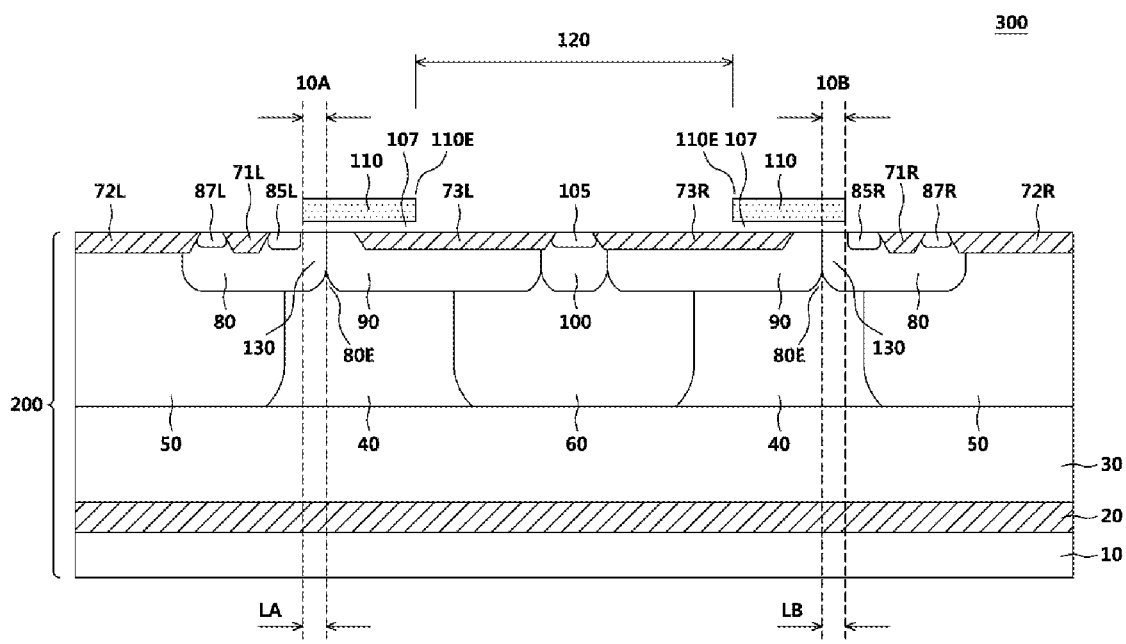
FIG. 6 is an enlarged plan view illustrating a source region and a bulk tab region in a semiconductor device.

FIG. 6 is a cross-sectional view of an example of a semiconductor device with a controllable channel length.

The semiconductor device 300 of the examples is an EDMOS device, where unlike in the alternative round type DMOS, the channel length of the examples may be controllable that the examples are able to be used as an analog device.

Referring to the example of FIG. 6, the number 10A or LA refers to a distance from the left edge of the gate electrode 110 to the right edge 80E of the N-type well region 80. Thus, 10A may correspond to a channel length. The exact channel length may be the distance from the second source region 85L to the right edge 80E of the N-type well region 80. The right edge 80E of the N-type well region 80 may be in contact with the P-type epitaxial layer 40 or the first P-type drift region 90.

Referring to the example of FIG. 6, the channel length may be increased by increasing the length of LA and LB, also referred to as 10A and 10B, respectively. A portion 130 where the N-type well region 80 and the gate electrode 110 overlap with each other is used to extend the channel length. The channel length of the channel region in the semiconductor device 300 may be controlled by extending or shrinking an overlapping region 130 where the N-type well region 80 and the gate electrode 110 overlap with each other.

Figure 7:
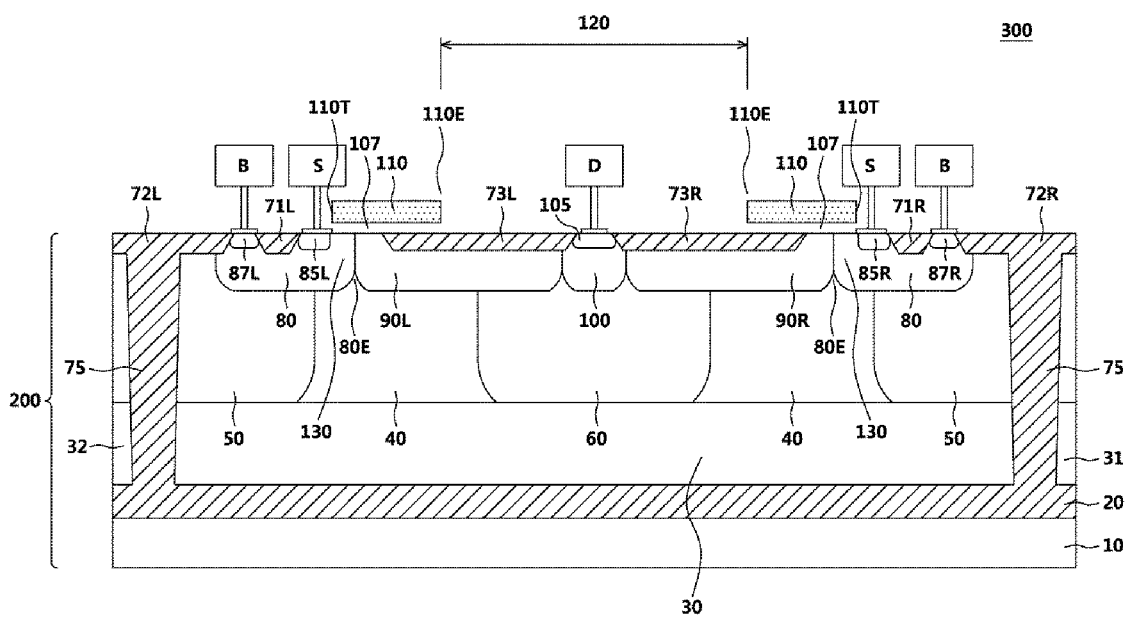
FIG. 7 is an A-A' cross-sectional view of the semiconductor device as shown in the example of FIG. 3.

Other regions are explained in further detail in the example of FIG. 7.

FIG. 7 is an A-A' cross-sectional view of a semiconductor device as shown in the example of FIG. 3.

Referring to the example of FIG. 7, the semiconductor device 300 may include a P-type well region 100 that is disposed in a substrate 200. An N-type well region 80 may be spaced apart from the P-type well region 100. A P-type drift region 90L may be disposed between the N-type well region 80 and the P-type well region 100. A gate electrode 110, at left, may be formed on the P-type well region 100, the N-type well region 80 and the P-type drift region 90L. A P-type source region 85L may be disposed in the N-type well region 80, thereby forming a channel region between the P-type source region 85L and the P-type drift region 90L. Also, a P-type drain region 105 may be disposed in the P-type well region 100.

Referring to the example of FIG. 7, the N-type well region 80 may be divided into a first N-type well region 80, at left, and a second N-type well region 80, at right. The first N-type well region 80, at left, may be connected with the second N-type well region 80, at right, in a top view, as shown in FIG. 3. In a similar manner, the gate electrode 110 may be divided into a first gate electrode 110, at left, and a second gate electrode 110, at right. The first gate electrode 110, at left, may be connected with the second gate electrode 110, at right, in a top view, as shown in FIG. 3, such that a ring shaped gate electrode having an opening area may be formed by a connection between the first gate electrode 110, at left, and the second gate electrode 110, at right. However, the first P-type drift region 90L and the second P-type drift region 90R may not be connected together in a top view and they may be separated and/or spaced apart from each other in another non-limiting example.

Referring to the example of FIG. 7, the semiconductor device 300 may further include a P-type deep well region 60 disposed below the P-type well region 100. An N-type deep well region 50 may be disposed below the N-type well region 80 and being spaced apart from the P-type deep well region 60. An N-type bulk tab region 87L may be disposed in the N-type well region 80 and may be spaced apart from the P-type source region 85L. An N-type buried impurity layer (NBL) 30, 31, 32 may be disposed in the substrate 200. A P-type epitaxial layer 40 may be disposed between the N-type deep well region 50 and the P-type deep well region 60.

Referring to the example of FIG. 7, the semiconductor device 300 may include a buried oxide film (BOX) 20 in the substrate 200 to isolate the semiconductor device 300 from a bottom substrate 10. Thus, the first, second and third N-type buried impurity layers 30, 31, 32 may be disposed on the buried oxide film 20. The P-type epitaxial layer 40 may be disposed on the N-type buried impurity layers 30, 31, 32. The P-type epitaxial layer 40 may be present in order to maintain a breakdown voltage (BVDSS), for example, 260V, which is a voltage greater than the operating voltage, for example, 200V. The area of the P-type epitaxial layer 40 may be reduced by dopants diffusion of the N-type deep well 50 due to thermal treatment, but may not be eliminated.

The P-type well 100 may be disposed on the upper surface of the P-type epitaxial layer 40. The N-type well 80 may be spaced apart in the horizontal direction at a predetermined distance from the P-type well 100 on the P-type epitaxial layer 40 and surrounding the outside of the P-type well 100. The N-type deep well 50 and the P-type deep well 60 may be disposed under the N-type well 80 and the P-type well 100, respectively. As illustrated in the example of FIG. 7, the horizontal length of the P-type well 100 may be less than the horizontal length of the P-type deep well 60. That is, the horizontal length of the P-type deep well 60 may be greater than the horizontal length of the P-type well 100.

The N-type well 80 may be disposed to overlap with a portion of the upper surface of the N-type deep well 50. The bottom surface of the N-type deep well 50 may be formed to have a depth so that it is in contact with the N-type buried impurity layers 30, 31, 32. The N-type well 80 may have the shape of a ring with an inner edge 80E. In such an example, the interface between the N-type well 80 and the first and second drift regions 90L, 90R may be the inner edge 80E.

In the semiconductor device 300, the drain region 105 connected with a drain electrode D may be disposed on a portion of the upper surface of the P-type well 100. Thus, the drain region 105 may be disposed at the center of the ring-shaped gate electrode, as shown in the top view. The first and second bulk tab regions 87L and 87R disposed in the N-type well 80 may be isolated from the first and second source regions 85L and 85R by the isolation regions 71L and 71R.

The first and second drift regions 90L and 90R may be formed by implanting P-type impurities into the P-type epitaxial layer 40. The first drift region 90L or the second drift region 90R may be in contact with a side surface of the N-type well 80 and a side surface of the P-type well 100. A bottom surface of the first drift region 90L or the second drift region 90R may be in contact with a top surface of the P-type deep well 60. The P-type well 100 may be sandwiched between the first and second drift regions 90L and 90R.

The gate insulating film 107 and the gate electrode 110 may be formed to cover a portion of the upper surface of the first and second drift regions 90L and 90R and a portion of the upper surface of the N-type well 80. The gate electrode 110 may be formed to have a ring shape of a closed loop, as shown in the example of FIG. 3. Thus, the gate electrode 110 may have an inner edge 110E and an outer edge 110T. The P-type well 100 and the P-type drain region 105 may be disposed in the closed loop of the gate electrode 110, and the first and second source regions 85L and 85R and the first and second bulk tap regions 87L and 87R may be disposed to be spaced apart at opposite sides of a portion of the outside of the closed loop 110T.

Referring to the above-discussed figures, in particular the examples of FIG. 3 and FIG. 7, a ring shape gate electrode with an opening area 120 may be formed by forming a connection between the first gate electrode, at the left in the example of FIG. 7, and the second gate electrode, at the right in the example of FIG. 7. The opening area 120 may include the P-type deep well region 60 and the P-type well region 100. The ring shape gate electrode may have at least one of its inner corners as having a round shape, as shown in the example of FIG. 3. The drain region 105 may be disposed inside the opening area 120, and the first and second source regions 85L and 85R may be disposed outside the opening area 120, as shown in the example of FIG. 3.

A portion of the upper surface of the semiconductor device 300 may be covered with the first isolation regions 71L, 71R, 72L, 72R, 73L and 73R. The first isolation regions 71L, 71R, 72L, 72R, 73L and 73R may be formed through a shallow trench isolation (STI), middle trench isolation (MTI), or Local Oxidation of Silicon (LOCOS) process. The first isolation regions 71L, 71R, 72L, 72R, 73L and 73R may be formed to be deeper than the first and second bulk tab regions 87L and 87R, the first and second source regions 85L and 85R, and the drain region 105. The first isolation regions 71L, 71R, 72L, 72R, 73L and 73R may have a depth shallower than a depth of the first and second drift regions 90L, 90R, the N-type well region 80 and the P-type well region 100.

The semiconductor device 300 may be enclosed by the second isolation region 75. The second isolation region 75 may extend from the upper surface of the first isolation regions 72L and 72R and may be formed deeply and vertically in order to be in contact with the buried oxide film 20. A second isolation region 75 may be disposed to be spaced apart from the first isolation regions 73L and 73R, wherein the second isolation region 75 may have a depth deeper than a depth of the first isolation regions 73L and 73R.

Further, as shown in the example of FIG. 3, the second isolation region 75 may be formed to have a shape of a ring of a closed loop, as seen in a top view. The second isolation region 75 may be formed through a deep trench isolation (DTI) process. That is, the semiconductor device 300 may be isolated from the adjacent semiconductor devices 400 and 500 by the buried oxide film 20, the first isolation regions 71L, 71R, 72L, 72R, 73L and 73R, and the second isolation region 75.

The first isolation regions 72L and 72R may be formed by overlapping each other with respect to the second isolation region 75. In order to minimize the chip area, the second isolation region 75 may be formed to pass through the first isolation regions 72L and 72R. Therefore, the first isolation regions 72L and 72R may be formed by an overlap of each other with respect to the second isolation region 75. The second isolation region may have a depth greater than a depth of the N-type deep well region 50 or the P-type deep well region 60. In such an example, the second isolation region 75 may directly contact the N-type buried impurity layer 30.

Referring to the example of FIG. 7, there are the first isolation regions 73L and 73R that overlap with the gate electrode 110. In other words, a first isolation region 73L overlaps with the first gate electrode 110, at left. A first isolation region 73R may overlap with the second gate electrode 110, at right. A second isolation region 75 may be disposed spaced apart from the first isolation regions 73L and 73R and enclosing the first gate electrode 110, at left, and the second gate electrode 110, at right.

As shown in the example of FIG. 7, the N-type buried impurity layer 30, the N-type deep well region 50, and the N-type well region 80 may surround the P-type epitaxial layer 40. A parasitic operation may be prevented by using the N-type buried impurity layer 30, the N-type deep well region 50 and the N-type well region 80. Otherwise, a P-type epitaxial layer 40 may have a possibility of having parasitic behavior because of the low concentration, of the P-type epitaxial 40. Therefore, the P-type epitaxial layer 40 may be surrounded by the N-type regions of the N-type buried impurity layer 30, the N-type deep well region 50, and the N-type well region 80, thereby preventing such a parasitic operation so that the device may be able to operate stably.

Thus, as shown in the example of FIG. 7, the P-type source regions 85L and 85R may be disposed closer to the second isolation region 75 than the P-type drain region 105. In such an example, such a structure may be referred to as a source edge structure. By contrast, when the P-type drain region 105 is disposed to be close to the second isolation region 75, the P-type drain region 105 may be referred to as a drain edge structure. In the pEDMOS structure of the examples, P-type source regions 85L and 85R may be formed in the N-type well region 80 so as to form a P-type channel. Thus, the source edge structure may have the pEDMOS structure of the examples. In addition, such a source edge structure may be proposed in examples because the device characteristics may be more stably implemented than in the drain edge structure. The P-type drain region 105 may be formed in the P-type well region 100 in the opening area 120 of the ring-shaped gate electrode. Alternatively, the P-type drain region 105 may be formed on the P-type deep well region 60.

With respect to FIG. 8 to FIG. 13, these figures are cross-sectional views illustrating a method for manufacturing a semiconductor device as illustrated in the example of FIG. 7.

Figure 8:
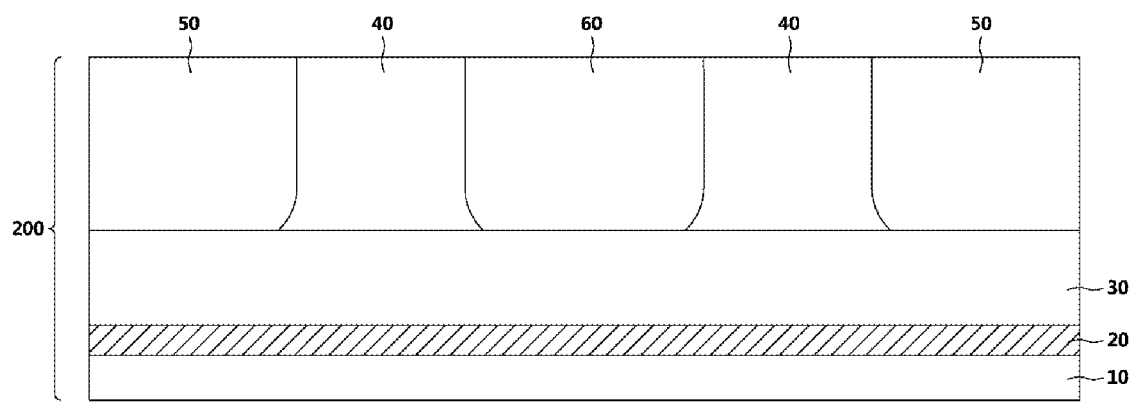
FIGS. 8-13 are views for explaining the manufacturing method for the semiconductor device shown in the example of FIG. 7.

Referring to the example of FIG. 8, first, a buried oxide film 20 may be formed on a bottom substrate 10 and an N-type buried impurity layer 30 may be formed on the buried oxide film 20. The N-type buried impurity layer 30 may serve to improve the breakdown voltage characteristics of the EDMOS transistor, and the impurity doping concentration of the N-type buried impurity layer 30 may preferably be higher than the impurity doping concentration of the P-type deep well region 60 and the N-type deep well region 50.

A P-type epitaxial layer 40 may be formed on the N-type buried impurity layer 30. A thickness of the P-type epitaxial layer 40 may be formed to be greater than a thickness of the N-type buried impurity layer 30. Therefore, the substrate 200 of the semiconductor device 300 may include the bottom substrate 10, the buried oxide film 20, the N-type buried impurity layer 30 and the P-type epitaxial layer 40.

Referring to the example of FIG. 8, a P-type deep well region DPW 60 and an N-type deep well region DNW 50 may be formed in the P-type epitaxial layer 40. When the P-type deep well region 60 and the N-type deep well region DNW 50 are formed to be in contact with the top surface of the N-type buried impurity layers 30, 31, 32, the electrical potential profile may be formed to be more stable. Additionally, the breakdown voltage may be stabilized because the N-type deep well region 50 may surround the outermost portion of the semiconductor device 300.

Figure 9:
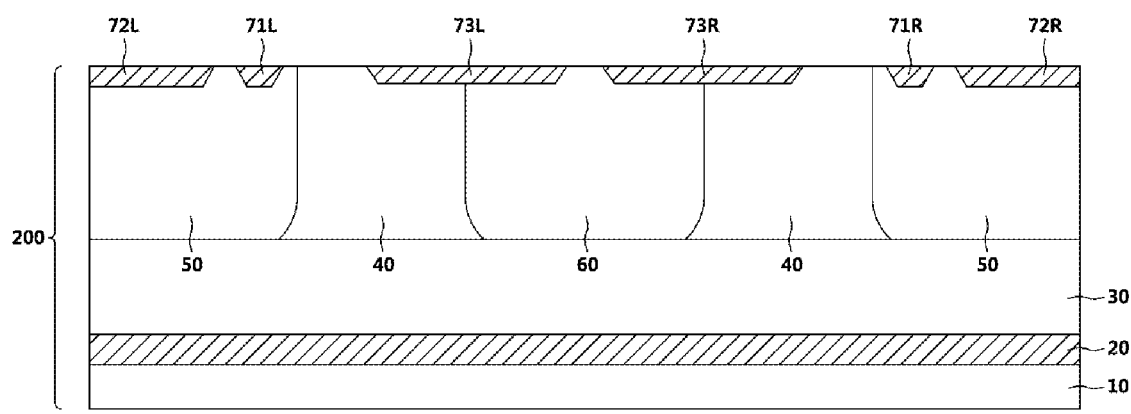

Referring to the example of FIG. 9, the first isolation regions 71L, 71R, 72L, 72R, 73L and 73R may be formed on the substrate, where the isolation regions 73L and 73R may overlap with the gate electrode. The first isolation regions 71L and 71R may cause isolation between the source region and the bulk tab region.

Figure 10:
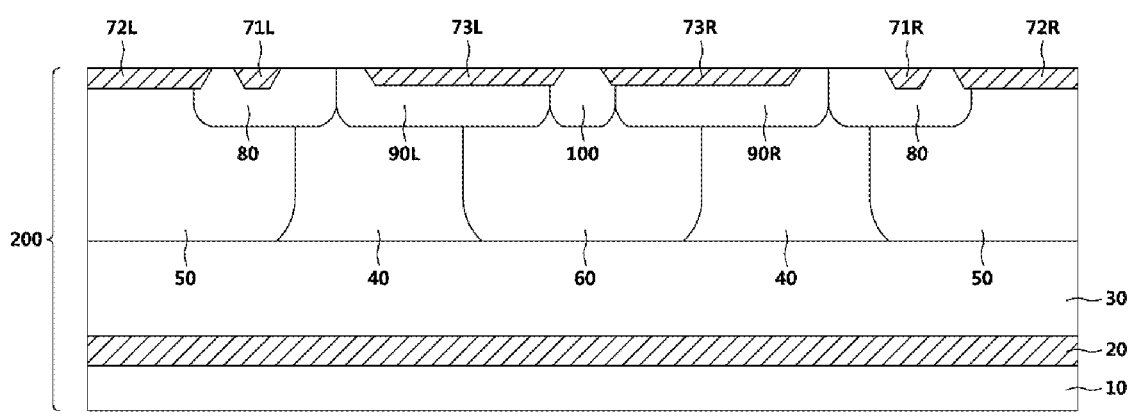

Referring to the example of FIG. 10, a P-type well region 100 may be formed under the first isolation regions 73L, 73R in the center of the semiconductor device. The depth of the P-type well region 100 may be formed to be shallower than the depth of the P-type deep well region 60 with respect to a top surface of the substrate. An N-type well region (NW) 80 may be formed on the N-type deep well region 50.

Additionally, first and second drift regions 90L, 90R may be formed between the P-type well region 100 and the N-type well region 80. One side and the other side of the drift region may be formed to be in contact with the P-type well region 100 and the N-type well region 80 to the channel length direction, respectively. The first and second drift regions 90L, 90R may extend the drain region and may be formed of P-type impurities, and may form a junction with one side of the N-type well region 80. That is, the P-type first and second drift regions 90L and 90R may be disposed as two drift wing regions so as to be in contact with one side of the N-type well 80 from the opposite sides of the P-type well 100, respectively. Additionally, the first and second drift regions 90L and 90R may be formed to be in contact with the P-type deep well region 60.

Figure 11:
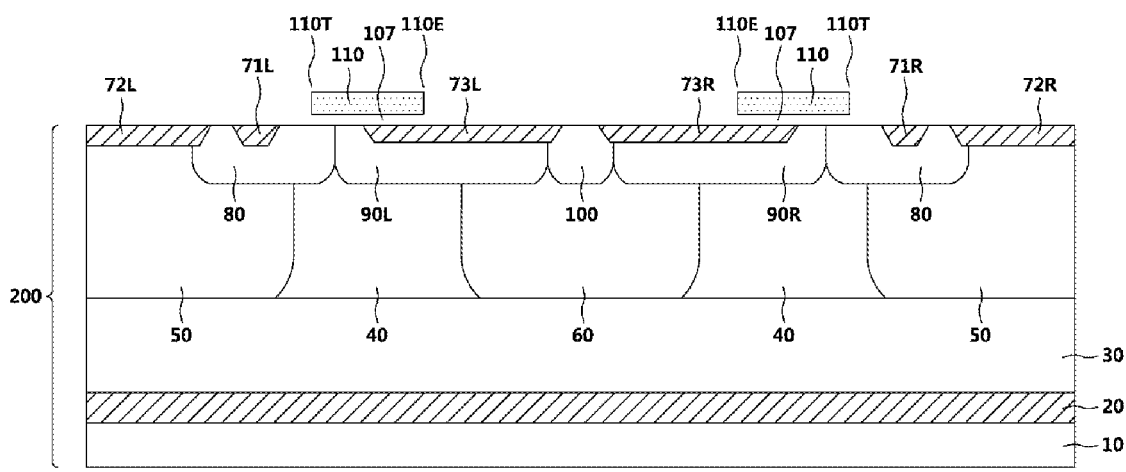

Referring to the example of FIG. 11, the gate insulating film 107 and the gate electrode 110 may be disposed on a portion of the upper surface of the substrate 200. The gate insulating film 107 and the gate electrode 110 may be disposed on the portions of the upper surface of the N-type well region 80, the P-type well region 100, and the first and second drift regions 90L and 90R.

Figure 12:
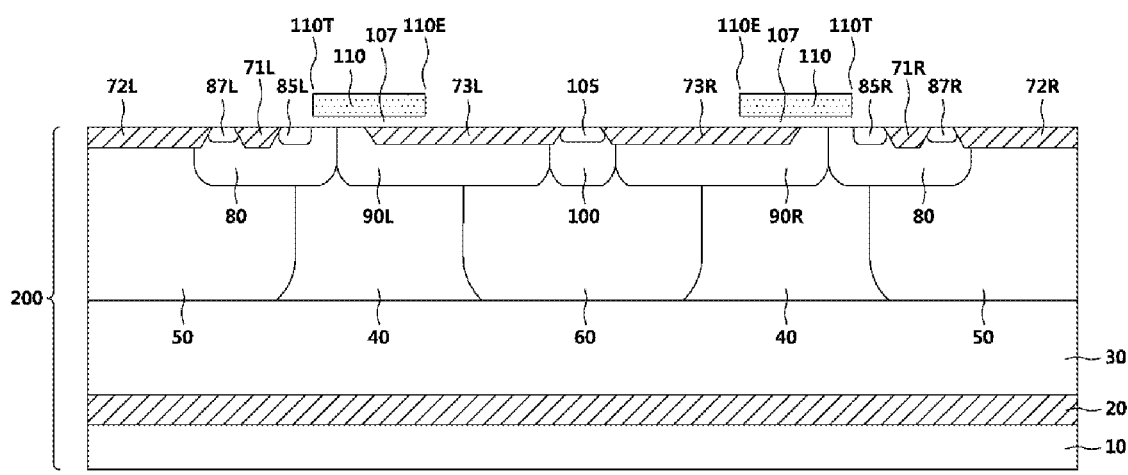

Referring to the example of FIG. 12, P-type impurities may be implanted into the N-type well region 80 in order to form first and second source regions 85L and 85R. N-type impurities may be implanted to form first and second bulk tap regions 87L and 87R. The source regions 85L and 85R may be spaced apart from the bulk tab regions 87L and 87R in the horizontal direction, and the source regions 85L and 85R may be disposed to be isolated by the first isolation regions 71L and 71R.

Additionally, a P-type impurity may be implanted into the P-type well region 100 in order to form a drain region 105. The drain region 105, the first and second source regions 85L and 85R, and the first and second bulk tap regions 87L and 87R may each have a depth smaller than a depth of the first isolation region or a depth of the P-type well region 100 or a depth of the N-type well region 80.

Figure 13:
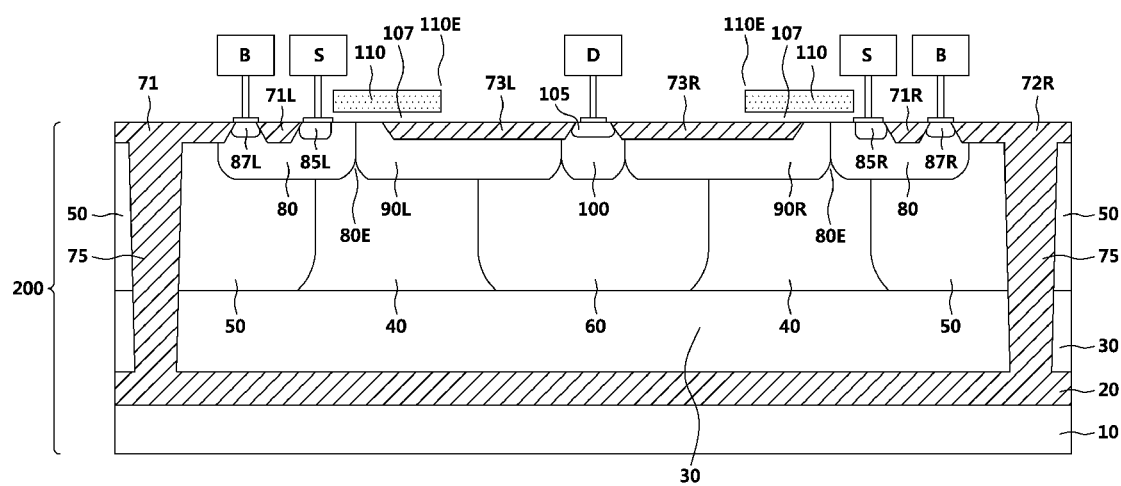

Referring to the example of FIG. 13, the semiconductor device 300 may be isolated from other adjacent semiconductor devices 400 and 500 by the formation of the second isolation region 75. The second isolation region may be formed by a Deep Trench Isolation (DTI) process, and may be formed to be in contact with the buried oxide film 20 from the first isolation regions 72L and 72R on the substrate. As illustrated in the example of FIG. 7, the second isolation region 75 may be formed to have a shape, as shown in a top view, of a closed loop surrounding the semiconductor device 300.

In such an example, a drain terminal D, a source terminal S, a bulk terminal B and a gate terminal G may be connected to the drain region 105, the first and second source regions 85L, 85R, the first and second bulk tap regions 87L, 87R and the gate electrode 110, respectively.

As shown in the examples from FIG. 8 to FIG. 13, a semiconductor device 300 including a first N-type well region 80, at left, is disposed in a substrate 200. A first P-type drift region 90L may be disposed to be in contact with the first N-type well region 80, at left. A first gate electrode 110, at left, may overlap with the first N-type well region 80, at left, and the first P-type drift region 90L. A second N-type well region 80, at right, may be disposed to be spaced apart from the first N-type well region 80, at left. A second P-type drift region 90R may be disposed to be in contact with the second N-type well region 80, at right. A second gate electrode 110, at right, may overlap with the second N-type well region 80, at right, and the second P-type drift region 90R. A P-type well region 100 may be disposed to be in contact with the first P-type drift region 90L and the second P-type drift region 90R. A drain region 105 may be disposed in the P-type well region 100. A first source region 85L may be disposed in the first N-type well region 80, at left, and a second source region 85R may be disposed in the second N-type well region 80, at right.

A first N-type deep well region 50, at left, may be disposed to be in contact with the first N-type well region 80, at left. A second N-type deep well region 50, at right, may be disposed to be in contact with the second N-type well region 80, at right. A P-type deep well region 50 may be disposed to be in contact with the P-type well region 100. A P-type epitaxial layer 40 may be disposed between the first N-type deep well region 80 and the P-type deep well region 60. An N-type buried impurity layer 30 may be disposed below the first N-type deep well region 50 and the P-type deep well region 60.

Figure 14:
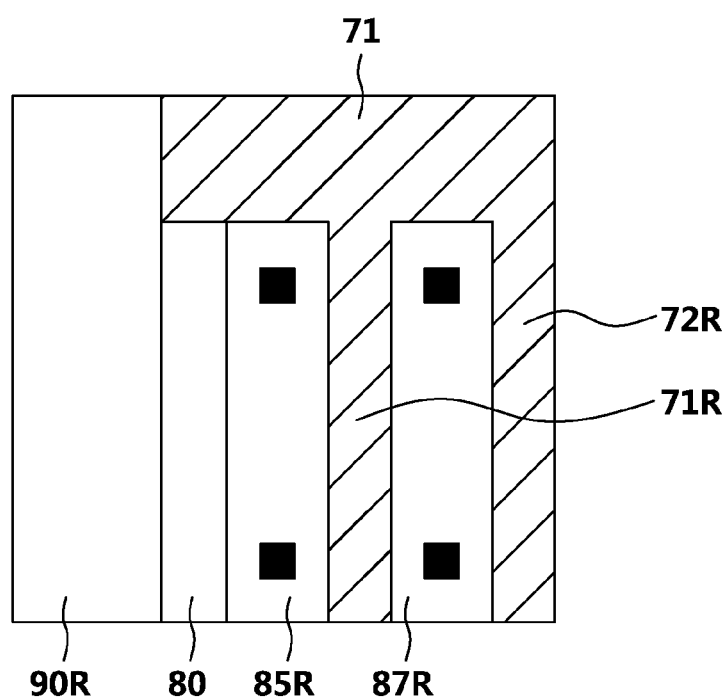
FIG. 14 is an enlarged plan view illustrating a source region and a bulk tab region in a semiconductor device.

FIG. 14 is an enlarged plan view illustrating a source region and a bulk tab region in the semiconductor devices of the examples.

Referring to the example of FIG. 14, the bulk tab region 87R may be formed to be isolated from the source region 85R by the first isolation region 71R. An EDMOS may be structured so that the bulk tap region 87R may be isolated from the source regions 85L and 85R, unlike a structure used in an LDMOS. To achieve this end, a first isolation region 71R may be formed between the source region and the bulk tab region. The first isolation region 71R may completely surround the source region 85R.

In summary, the semiconductor device 300 may include a ring-shaped gate electrode 110 having an opening area 120 on a substrate 200, a drain region 105 formed in the opening area 120 and formed spaced apart from the gate electrode 110 by a predetermined distance, an N-type well region 80 that overlaps with the gate electrode 110, and a source region 85L and 85R formed next to the gate electrode 110. in the semiconductor device 300, an inner corner of the gate electrode 110 may have a second radius of curvature, a corner of the N-type well region 80 may have a third radius of curvature, and the third radius of curvature may be greater than the second radius of curvature.

The semiconductor device 300 may further include a P-type deep well region 100 in the P-type epitaxial layer 40, and the corner of the P-type deep well region may have a first radius of curvature, the second radius of curvature being greater than the first radius of curvature. The semiconductor device 300 may further include a first isolation region 73L and 73R formed to overlap the gate electrode, and a second isolation region 72L and 72R surrounding the gate electrode 110. The depth of the second isolation region 72L and 72R may be deeper than that of the first isolation region 73L and 73R.

Figure 15:
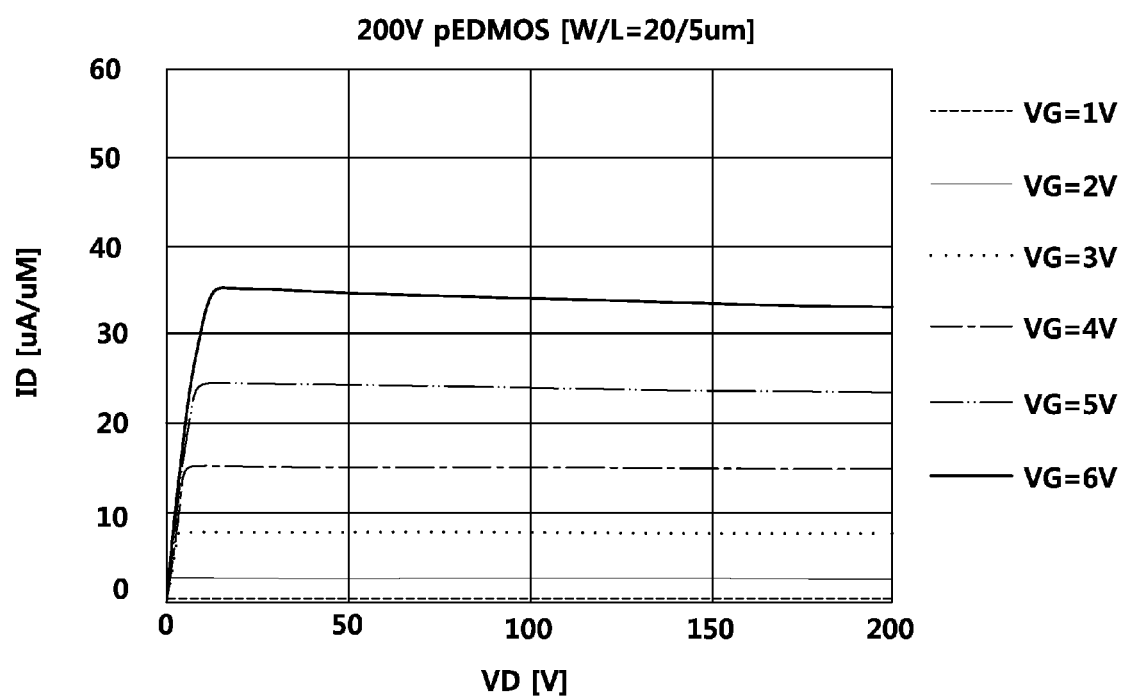
FIG. 15 shows a voltage-current graph according to the operation of a semiconductor device as shown in the example of FIG. 6 or the example of FIG. 7.

FIG. 15 shows a voltage-current graph according to the operation of the semiconductor device shown in the example of FIG. 7.

Referring to the example of FIG. 15, even when the drain voltage VD is stably applied to 200V, the current in the drain ID may be stably supplied. In other words, the current characteristics of the semiconductor device are excellent in that the operation characteristics of the semiconductor device are improved for the applications in which the semiconductor device is used.

As described above, the semiconductor device of the present disclosure may have higher breakdown voltage characteristics than those resulting from isolating between adjacent active regions using a junction isolation technique, by including an isolation region having a structurally deep trench shape. Accordingly, the operating voltage characteristics and the degree of integration of the semiconductor device for high voltage may be effectively improved, according to examples.

In another aspect, the examples may reduce the on-resistance of the semiconductor device by reducing the total area of the semiconductor device, thereby improving the operational characteristics of the semiconductor device.

In addition, the semiconductor device of the examples may be suitable for use as an analog device because the semiconductor device has an easily controllable channel length.

While this disclosure includes specific examples, it will be apparent after an understanding of the disclosure of this application that various changes in form and details is made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method of a semiconductor device, the method comprising:
   forming an N-type buried impurity layer in a substrate;
   forming a first N-type deep well region, a P-type deep well region, and a second N-type deep well region on the N-type buried impurity layer;
   forming shallow isolation regions on the substrate;
   forming a first N-type well region, a P-type well region, and a second N-type well region on the first N-type deep well region, the P-type deep well region, and the second N-type deep well region, respectively;
   forming a first gate electrode disposed between the first N-type well region and the P-type well region on the substrate;
   forming a second gate electrode disposed between the P-type well region and the second N-type well region on the substrate;
   forming a first P-type source region, a P-type drain region, and a second P-type source region on the first N-type well region, the P-type well region, and the second N-type well region, respectively; and forming deep trench isolation regions surrounding the first and the second gate electrodes, wherein the first and second gate electrodes are disposed to overlap the shallow isolation regions and not overlap the P-type deep well region, wherein the shallow isolation regions are spaced apart from the P-type deep well region, and wherein each of the deep trench isolation regions has a depth greater than a depth of each of the first N-type deep well region, the P-type deep well region, and the second N-type deep well region.

2. The method of claim 1, further comprising forming a first P-type drift region and a second P-type drift region adjacent to the P-type well region, wherein the first P-type drift region is disposed between the first N-type well region and the P-type well region, wherein the second P-type drift region is disposed between the P-type well region and the second N-type well region, and wherein the first P-type drift region and the second P-type drift region are in contact with the P-type deep well region.

3. The method of claim 1, wherein the P-type deep well region is disposed to surround the P-type well region, and has a horizontal length greater than that of the P-type well region.

4. The method of claim 1, further comprising:

forming a buried oxide film in the substrate, the buried oxide film being in direct contact with the deep trench isolation regions; and forming a first N-type bulk tab region and a second N-type bulk tab region adjacent to the first P-type source region and the second P-type source region, respectively.

5. The method of claim 4, wherein the shallow isolation regions comprise:

a first isolation region overlapping the first gate electrode;

a second isolation region overlapping the second gate electrode;

a third isolation region disposed between the first N-type bulk tap region and the first P-type source region; and a fourth isolation region disposed between the second N-type bulk tap region and the second P-type source region.

6. The method of claim 1, wherein the first gate electrode and the second gate electrode are connected to each other to form a ring-shaped gate electrode having an opening area on the substrate, wherein the P-type drain is formed in the opening area, and wherein an inner edge of the gate electrode comprises first to fourth corners each having a round shape.

7. The method of claim 1, wherein the first N-type well region and the second N-type well region are connected to each other to form an N-type well region surrounding an outermost portion of the semiconductor device, and wherein the P-type deep well region is spaced apart from the first and second N-type deep well regions.

8. A manufacturing method of a semiconductor device, the method comprising:

forming a buried impurity layer in a substrate;

forming a first deep well region, a second deep well region, and a third deep well region spaced apart from each other on the buried impurity layer;

forming shallow isolation regions on the substrate;

forming a first well region, a second well region, and a third well region on the first deep well region, the second deep well region, and the third deep well region, respectively;

forming a first gate electrode disposed between the first well region and the second well region on the substrate;

forming a second gate electrode disposed between the second well region and the third well region on the substrate;

forming a first source region, a drain region, and a second source region on the first well region, the second well region, and the third well region, respectively; and forming deep trench isolation regions surrounding the first gate electrode and the second gate electrode, wherein the first gate electrode and the second gate electrode are connected to each other to form a ring-shaped gate electrode having an opening area in which the drain region is formed, wherein the first and second gate electrodes are disposed to overlap the shallow isolation regions and not overlap the second deep well region, wherein the shallow isolation regions are spaced apart from the P-type deep well region, and wherein each of the deep trench isolation regions has a depth greater than a depth of each of the first deep well region, the second deep well region, and the third deep well region.

9. The method of claim 8, further comprising forming a first drift region and a second drift region adjacent to the second well region, wherein the first drift region is disposed between the first well region and the second well region, and the first drift region abuts the first well region and the second well region, and wherein the second drift region is disposed between the second well region and the third well region, and the second drift region abuts the second well region and the third well region, and wherein the first drift region and the second drift region are in contact with the second deep well region.

10. The method of claim 8, further comprising forming a buried oxide film in the substrate, wherein the buried oxide film is in direct contact with the deep trench isolation regions.

11. The method of claim 8, wherein the first source region and the second source region are disposed outside the opening area, and the drain region is disposed inside the opening area, and wherein an inner edge of the ring-shaped gate electrode comprises first to fourth corners each having a round shape.

12. The method of claim 11, wherein the second deep well region is disposed in the opening area, and wherein the second deep well region has a smaller area than the opening area in plan view.

13. A manufacturing method of a semiconductor device, the method comprising:

forming an N-type buried impurity layer in a substrate;

forming an N-type deep well region surrounding an outermost portion of the semiconductor device;

forming a P-type deep well region spaced apart from the N-type deep well region, the P-type deep well region and the N-type deep well region being in direct contact with an upper surface of the N-type buried impurity layer;

forming an N-type well region and a P-type well region in contact with the N-type deep well region and the P-type deep well region, respectively;

forming a P-type drift region disposed between the N-type well region and the P-type well region, the P-type drift region abutting the N-type well region and the P-type well region and disposed on the P-type deep well region;

forming a ring-shaped gate electrode having an opening area and overlapping the N-type well region and the P-type drift region;

forming a first P-type source region and a second P-type source region on the N-type well region, and forming a P-type drain region on the P-type well region; and forming a deep trench isolation region surrounding the first source region and the second source region, wherein the ring-shaped gate electrode is disposed not to overlap with the P-type deep well region, and wherein the P-type drain region is formed in the opening area.

14. The method of claim 13, further comprising:

forming a buried oxide film in the substrate, the buried oxide film being in direct contact with the deep trench isolation region; and forming a first N-type bulk tab region and a second N-type bulk tab region adjacent to the first P-type source region and the second P-type source region, respectively.

15. The method of claim 13, wherein the P-type deep well region is disposed to surround the P-type well region, and has a horizontal length greater than that of the P-type well region.

16. The method of claim 14, further comprising forming a shallow isolation region comprising:

a first shallow isolation region overlapping the gate electrode and the P-type deep well region;

a second shallow isolation region disposed between the first N-type bulk tap region and the first P-type source region; and a third shallow isolation region disposed between the second N-type bulk tap region and the second P-type source region.

17. The method of claim 1, wherein the first N-type deep well region is disposed to overlap the first N-type well region and the first P-type source region, and wherein the N-type buried impurity layer is disposed to overlap the P-type well region and the P-type drain region.

18. The method of claim 8, wherein the first deep well region is disposed to overlap the first well region and the first source region, and wherein the buried impurity layer is disposed to overlap the second well region and the drain region.

19. The method of claim 13, wherein the N-type deep well region is disposed to overlap the N-type well region and the first and second P-type source regions, and wherein the N-type buried impurity layer is disposed to overlap the P-type well region and the P-type drain region.

* * * * *